United States Patent
Geris

(10) Patent No.: US 8,893,710 B2
(45) Date of Patent: Nov. 25, 2014

(54) SOLAR COLLECTION SYSTEM AND SOLAR COLLECTOR THEREFOR

(76) Inventor: Robert Warren Geris, Marshall, VA (US)

(*) Notice: Subject to any disclaimer, the term of this patent is extended or adjusted under 35 U.S.C. 154(b) by 371 days.

(21) Appl. No.: 13/348,083

(22) Filed: Jan. 11, 2012

(65) Prior Publication Data

US 2012/0174908 A1  Jul. 12, 2012

Related U.S. Application Data

(60) Provisional application No. 61/432,100, filed on Jan. 12, 2011.

(51) Int. Cl.
| | |
|---|---|
| *F24J 2/24* | (2006.01) |
| *F24J 2/04* | (2006.01) |
| *F24J 2/52* | (2006.01) |
| *H01L 31/0232* | (2014.01) |
| *H01L 31/052* | (2014.01) |
| *F24J 2/07* | (2006.01) |
| *F24J 2/10* | (2006.01) |

(52) U.S. Cl.
CPC ............ *H01L 31/0525* (2013.01); *Y02E 10/41* (2013.01); *Y02E 10/52* (2013.01); *F24J 2/24* (2013.01); *F24J 2/07* (2013.01); *F24J 2002/109* (2013.01)
USPC ........... 126/600; 126/634; 126/684; 126/687; 126/709; 126/663; 126/646; 136/259

(58) Field of Classification Search
CPC ........................................................ F24J 2/04
USPC ......... 126/573, 609, 646, 634, 270, 635, 583, 126/651; 136/259
See application file for complete search history.

(56) References Cited

U.S. PATENT DOCUMENTS

| | | | | |
|---|---|---|---|---|
| 3,985,119 | A * | 10/1976 | Oakes, Jr. ..................... | 126/600 |
| 3,986,490 | A * | 10/1976 | Chao et al. ..................... | 126/694 |
| 4,148,300 | A * | 4/1979 | Kaufman, Sr. ................ | 126/684 |
| 4,149,525 | A * | 4/1979 | Prado ............................ | 126/654 |
| 4,249,515 | A * | 2/1981 | Page ............................. | 126/676 |
| 4,281,641 | A * | 8/1981 | Devore ......................... | 126/605 |
| 4,340,035 | A * | 7/1982 | Begun .......................... | 126/676 |
| 4,345,645 | A * | 8/1982 | Bratt ............................. | 165/176 |
| 4,376,372 | A * | 3/1983 | English, Jr. ................. | 60/641.15 |

(Continued)

FOREIGN PATENT DOCUMENTS

| | | | | | |
|---|---|---|---|---|---|
| GB | | 2172394 A | * | 9/1986 | ................ F24J 2/04 |
| WO | WO 2009015388 A2 | * | 1/2009 | ............. Y02E 10/47 |

*Primary Examiner* — Kang Hu
*Assistant Examiner* — Rabeeul Zuberi
(74) *Attorney, Agent, or Firm* — Matthew J. Lattig; Charter IP, LLC

(57) ABSTRACT

A solar collection system is described that includes an elongate central truss angled upward from ground horizontal and mounted on a plurality of ground support legs, a collector subsystem mounted at one end of the central truss, a cross truss perpendicular to the central truss and mounted at an end of the central truss opposite the collector subsystem, and a reflector subsystem mounted on the cross truss. The collector subsystem includes a truncated trapezoid-shaped housing with a front side facing the reflector subsystem, the front side including a glassed-in opening fronting a V-shaped core heat mechanism enclosed within the housing interior that captures reflected photon energy from the reflector subsystem which heats a fluent medium within the V-shaped core heat mechanism for output to an external source for thermal power operations.

12 Claims, 5 Drawing Sheets

(56) References Cited

U.S. PATENT DOCUMENTS

| | | | |
|---|---|---|---|
| 4,433,672 A * | 2/1984 | Hale et al. | 126/601 |
| 4,457,297 A * | 7/1984 | Sobczak et al. | 126/605 |
| 4,479,485 A * | 10/1984 | McDougal et al. | 126/648 |
| 4,583,520 A * | 4/1986 | Dietrich et al. | 126/606 |
| 4,604,990 A | 8/1986 | Nikkel | |
| 5,103,803 A * | 4/1992 | Epifanidis | 126/609 |
| 5,245,986 A * | 9/1993 | Karni | 126/680 |
| 5,758,938 A * | 6/1998 | Osterwisch | 353/3 |
| 6,057,505 A * | 5/2000 | Ortabasi | 136/246 |
| 7,263,992 B2 * | 9/2007 | Zhang | 126/651 |
| 7,552,727 B2 * | 6/2009 | Matthews, Jr. | 126/680 |
| 7,902,451 B2 * | 3/2011 | Shimizu | 136/244 |
| 8,166,966 B2 * | 5/2012 | Detch | 126/684 |
| 8,410,351 B1 * | 4/2013 | Gu | 136/246 |
| 8,662,072 B2 * | 3/2014 | Butler et al. | 126/607 |
| 2007/0033828 A1 * | 2/2007 | Hartkop et al. | 34/443 |
| 2007/0221208 A1 * | 9/2007 | Goldman | 126/651 |
| 2007/0227574 A1 * | 10/2007 | Cart | 136/206 |
| 2007/0289622 A1 * | 12/2007 | Hecht | 136/246 |
| 2008/0135085 A1 * | 6/2008 | Corrales et al. | 136/246 |
| 2009/0139512 A1 * | 6/2009 | Lima | 126/600 |
| 2009/0194146 A1 * | 8/2009 | Simon | 136/248 |
| 2009/0223553 A1 * | 9/2009 | Thoroughgood | 136/246 |
| 2009/0314283 A1 * | 12/2009 | Kimura et al. | 126/696 |
| 2010/0205963 A1 | 8/2010 | Ammar | |
| 2010/0241401 A1 * | 9/2010 | Martindale | 702/182 |
| 2012/0180847 A1 * | 7/2012 | Wang | 136/246 |
| 2012/0312017 A1 * | 12/2012 | Fraser et al. | 60/641.15 |

* cited by examiner

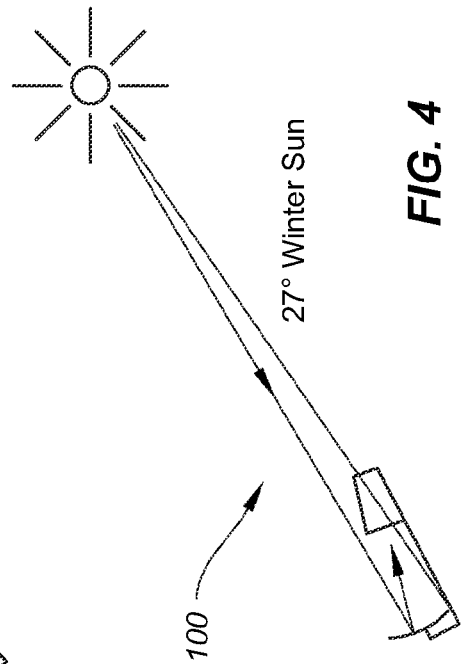
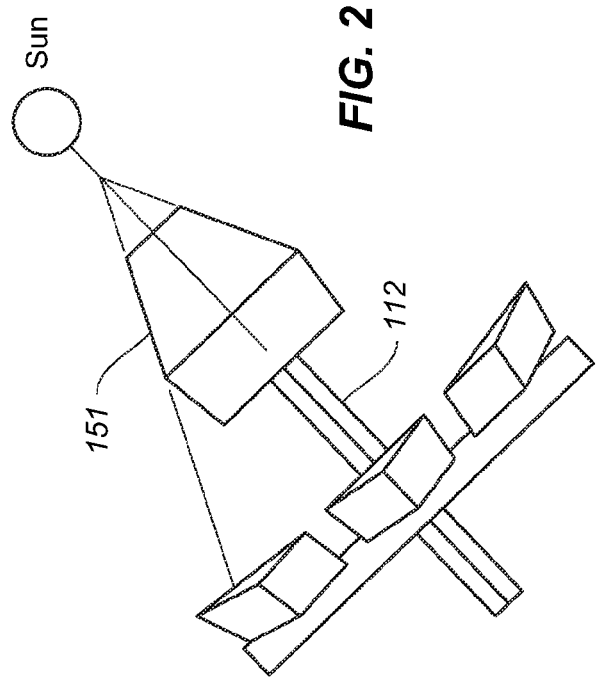
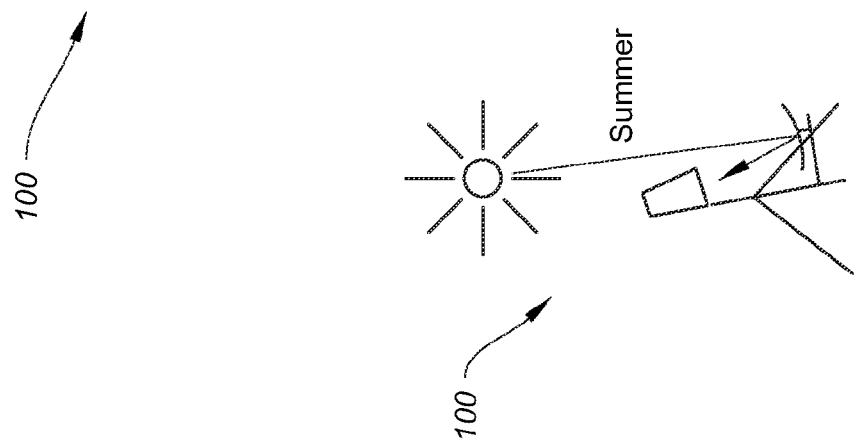

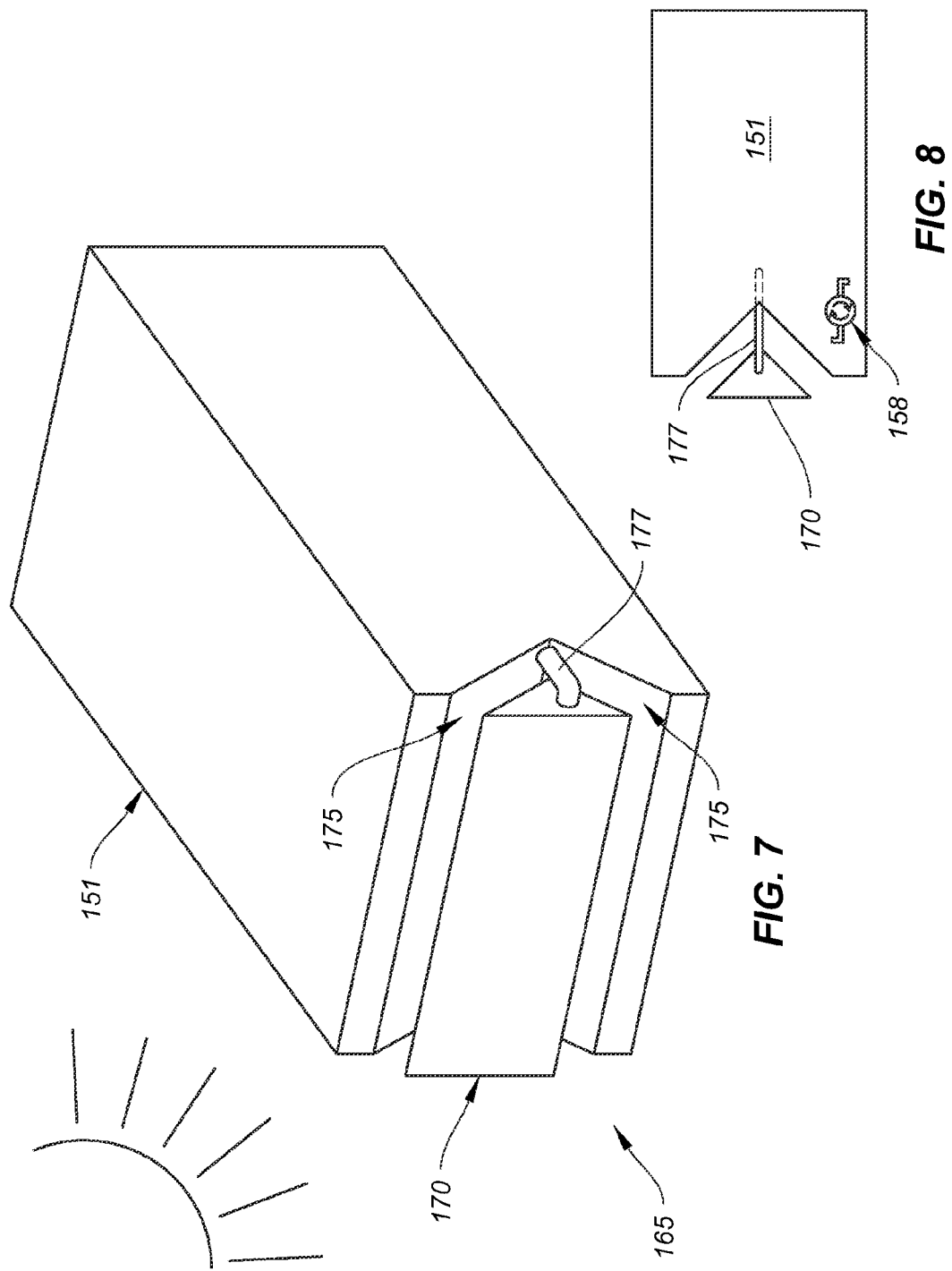

SOLAR COLLECTION SYSTEM AND SOLAR COLLECTOR THEREFOR

CROSS-REFERENCE TO RELATED APPLICATION

The present application claims the benefit under 35 U.S.C. §119(e) of U.S. Provisional Patent Application No. 61/432,100 to the inventor, filed Jan. 12, 2011, the entire contents of which is hereby incorporated by reference herein.

BACKGROUND

1. Field

Example embodiments in general relate to a solar collection system for generating thermal power and to a solar collector of the system.

2. Related Art.

Solar power generation systems have been developed in an effort to provide passive power generation without the use of resource-limiting fossil fuels. The tremendous energy output of the sun has been recognized for some time, with numerous attempts being made at harnessing and converting it for useful purposes. Today's high cost of energy (fuel oil, natural gas/propane, electricity, etc.), has focused attention on solar energy as an alternative source. The sun's energy has been successfully converted into electrical energy with solar batteries and similarly the sun's energy has been converted into heating systems by so-called solar heaters, furnaces and the like. Conventional solar collection systems for thermal output such as solar furnaces, however, have been typified by an extremely large collector plate, heated only on one side, covering large portions of a roof or ground-mount structure. These furnaces also require large storage chambers, usually in the substructure of the building, where the heat is stored after having been transferred from the collector by a fluid median. The heat in the storage chamber is then circulated through the building by a fluid.

One conventional system includes a reflector unit having a frame with metal side walls and end walls connected together in a generally parabolic shape. The frame is pivotally mounted to pylons above ground and tilted by operation of a drive mechanism and drive motor.

The frame typically supports a number of solar panels which collectively form a structure for receiving incident sunlight from the sun and reflect it onto some type of receiver tube located in a fixed position relative to the frame. The solar panels function to the direct incident sunlight onto the receiver tube to elevate the temperature of heat transfer fluid circulating within the receiver tube to a level sufficient to operate a power platform, such as a steam generator.

Many conventional systems such as to aforementioned require a significant amount of capital investment. As such, any savings of conventional energy could only be forecasted to pay back to the investor his investment after ten years or more. Moreover, conventional solar collection systems for thermal output have often been grossly inefficient, averaging only 20% or less, contributing to the long pay back.

These solar collection systems, which not only have been large in size and expensive to install, have proven inefficient, such inefficiency contributing to their large size. Initially, these systems have not been capable of being easily installed in existing building structures and have been useful only as an auxiliary heating unit to a structure having conventional forced air heating systems. Further, very little effort has been given to employing passive means of heating other facilities associated with a household or a recreation facility by solar means, such as an in-ground swimming pool.

SUMMARY

An example embodiment is directed to a solar collection system for generating thermal power. The system includes an elongate central truss angled upward from ground horizontal and mounted on a plurality of ground support legs, a collector subsystem mounted at one end of the central truss, a cross truss perpendicular to the central truss and mounted at an end of the central truss opposite the collector subsystem, and a reflector subsystem mounted on the cross truss. The collector subsystem includes a truncated trapezoid-shaped housing with a front side facing the reflector subsystem, the front side including a glassed-in opening fronting a V-shaped core heat mechanism enclosed within the housing interior that captures reflected photon energy from the reflector subsystem which heats a fluent medium within the V-shaped core heat mechanism for output to an external source for thermal power operations.

Another example embodiment is directed to a solar collection system having an elongate central truss angled upward from ground horizontal and mounted on a plurality of ground support legs, a cross truss perpendicular to the central truss and mounted at one end of the central truss, a plurality of reflectors mounted in spaced relation on the cross truss, and a truncated trapezoid-shaped housing mounted at the other end of the central truss at a higher height relative to the ground than the reflectors. The housing encloses a V-shaped core heat mechanism containing a fluent medium therein, the V-shaped core heat mechanism configured to capture reflected photon energy from the reflectors. The system further includes a pump, and a photovoltaic cell powering the pump to output the heated fluent medium to an external source for thermal power operations.

Another example embodiment is directed to a solar collector of a solar collection system for generating thermal power which includes one or more reflectors. The collector includes a truncated trapezoid-shaped housing arranged in spaced relation to and at height higher relative to the ground than the reflectors, a front side of the housing facing the reflectors and including a glassed-in opening, and a V-shaped core heat mechanism containing a fluent medium therein. The V-shaped core heat mechanism is enclosed within the housing behind the glassed-in opening and is configured to capture reflected photon energy from the reflectors.

BRIEF DESCRIPTION OF THE DRAWINGS

Example embodiments will become more fully understood from the detailed description given herein below and the accompanying drawing, wherein like elements are represented by like reference numerals, which are given by way of illustration only and thus are not limitative of the example embodiments herein.

FIG. 2 is an overhead view of the system of FIG. 1.

FIG. 3 is a partial perspective view of the system in a summer sun orientation.

FIG. 4 is a partial perspective view of the system in a winter sun orientation.

FIG. 7 is an enlarged partial view of the rear of the collector subsystem to illustrate constituent components of an auxiliary unit in more detail thereof.

FIG. 8 is a side view of the collector subsystem to illustrate selected constituent components thereof.

DETAILED DESCRIPTION

Figure 1:
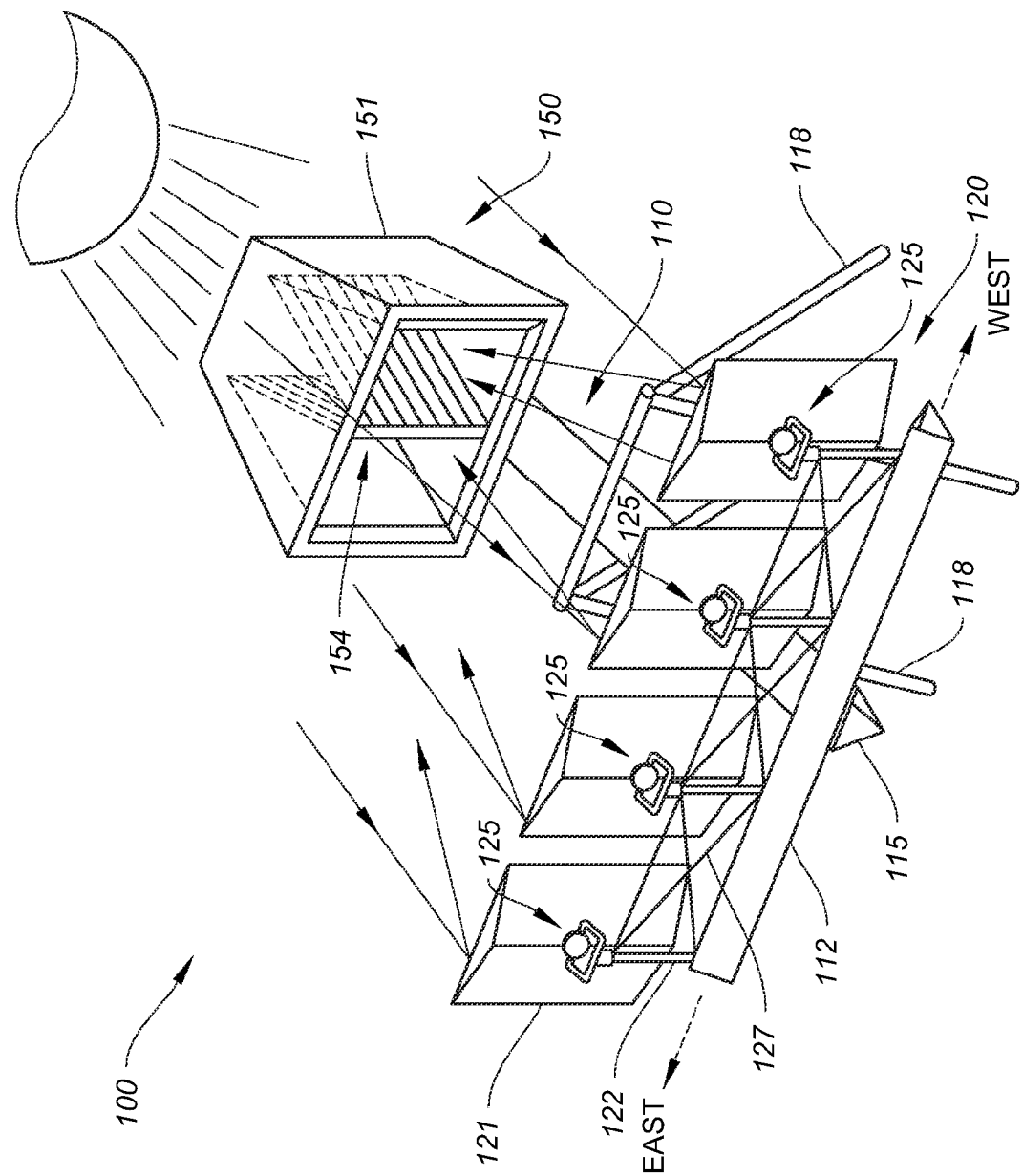
FIG. 1 is a perspective view of solar collection system for generating thermal power in accordance with an example embodiment.

As to be set forth more fully below, an example is directed to a solar collection system for generating thermal power, and to a solar collector of the system. Referring to FIGS. 1-4, system 100 includes a support subsystem 110, reflector subsystem 120 and collector subsystem 150. Support subsystem 110 may include a cross support truss 112, an elongate, angled central truss 115 and ground support legs 118. The legs 118 support the bulk of the weight of system 100 on a ground surface, and includes a copper grounding plate 119. The cross support truss 112 supports the reflector subsystem 120 thereon. The central truss 115 supports the collector subsystem 150 at one end thereof, and reflector subsystem 120 at the other end thereof on cross support truss 112. Each of the constituent components of the support subsystem 110 in an example may be fabricated from 1' triangular truss frame aluminum stock, for example.

The reflector subsystem 120 includes a plurality of reflectors 121. Each reflector 121 may have a generally parabolic shape and be made of a silvered mirrored material or other material having a highly reflective property. In an example, the reflector 121 may be a 4'×4' mirror; in the four reflector embodiment this provides for 64 ft$^2$ of reflection surface area from the sun onto the collector subsystem 150.

Each reflector 121 may be supported by a metal reflector support 122, which in an example may be aluminum. Each reflector 121 may be individually controlled by DC-powered (motorized) GPS gimbal mechanism 125, for example so as to be able to track the azimuth angle of the sun depending on the time of year. In the example as shown, a rear surface of each reflector 121 is attached to a motorized GPS gimbal mechanism 125, which may, for example, be software controlled through a Program Logic Controller ("PLC") or other controller device. The purpose of the universal GPS gimbal mechanism 125 provides year-around sun tracking during daylight hours.

FIGS. 3 and 4 show example orientation during summer and winter. To provide further support, especially in wind-swept environments, cable tensioners 127 may be employed between the reflectors 121 of the reflector subsystem 120. Each of the reflector supports 122 and cable tensioners 127 are supported by cross truss 112, which distributes the weight in reflector subsystem 120.

The collector subsystem 150 includes a lightweight but highly insulated housing 151. Housing 151 has a generally truncated trapezoidal-shape with one end 152 open but having a glassed-in window 153 behind which resides a V-shaped core heat mechanism 154 therein. The core heat mechanism 154 captures reflected photon energy off each of the angular separated reflectors 121 of the reflector subsystem 120, for output to an external source for thermal power operations.

Figure 5:
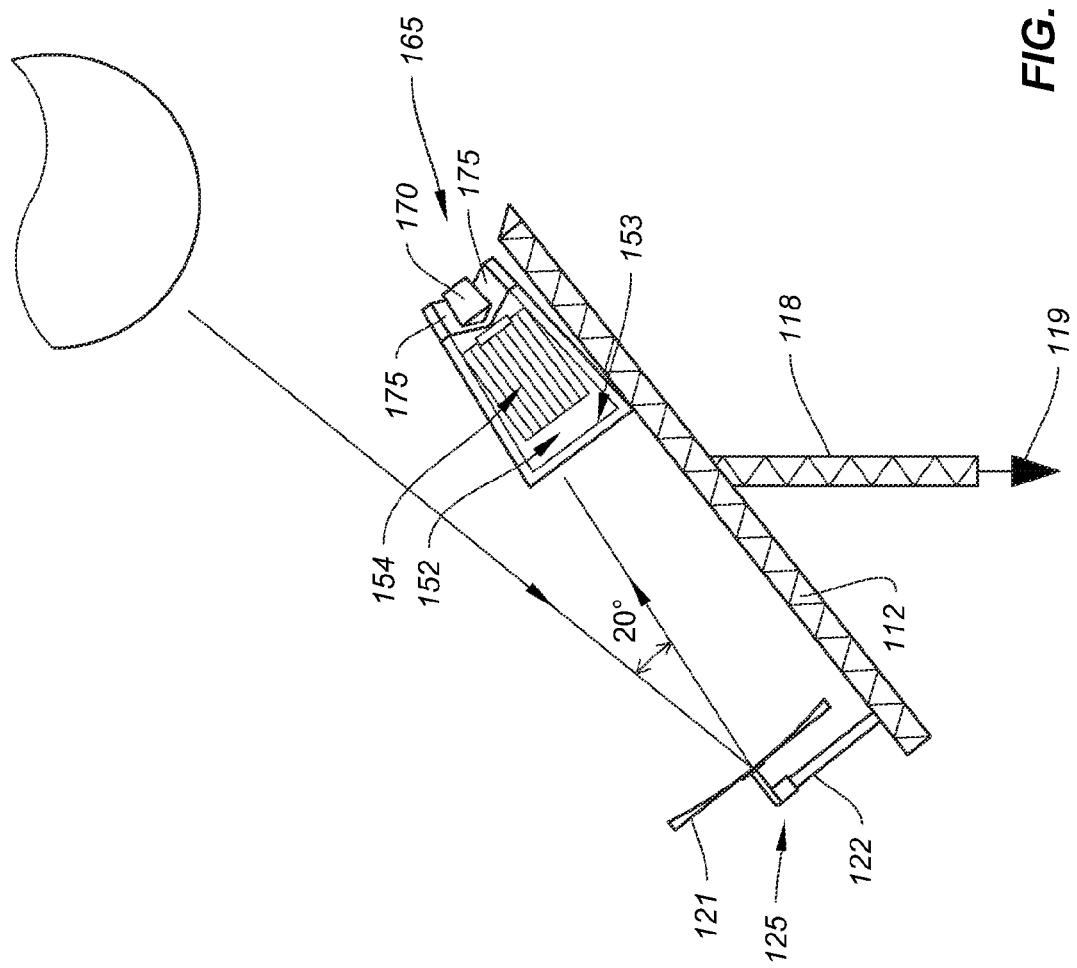
FIG. 5 is a side profile view to illustrate the relative incident angle of reflection onto the collector subsystem according to the example embodiment.
Figure 6:
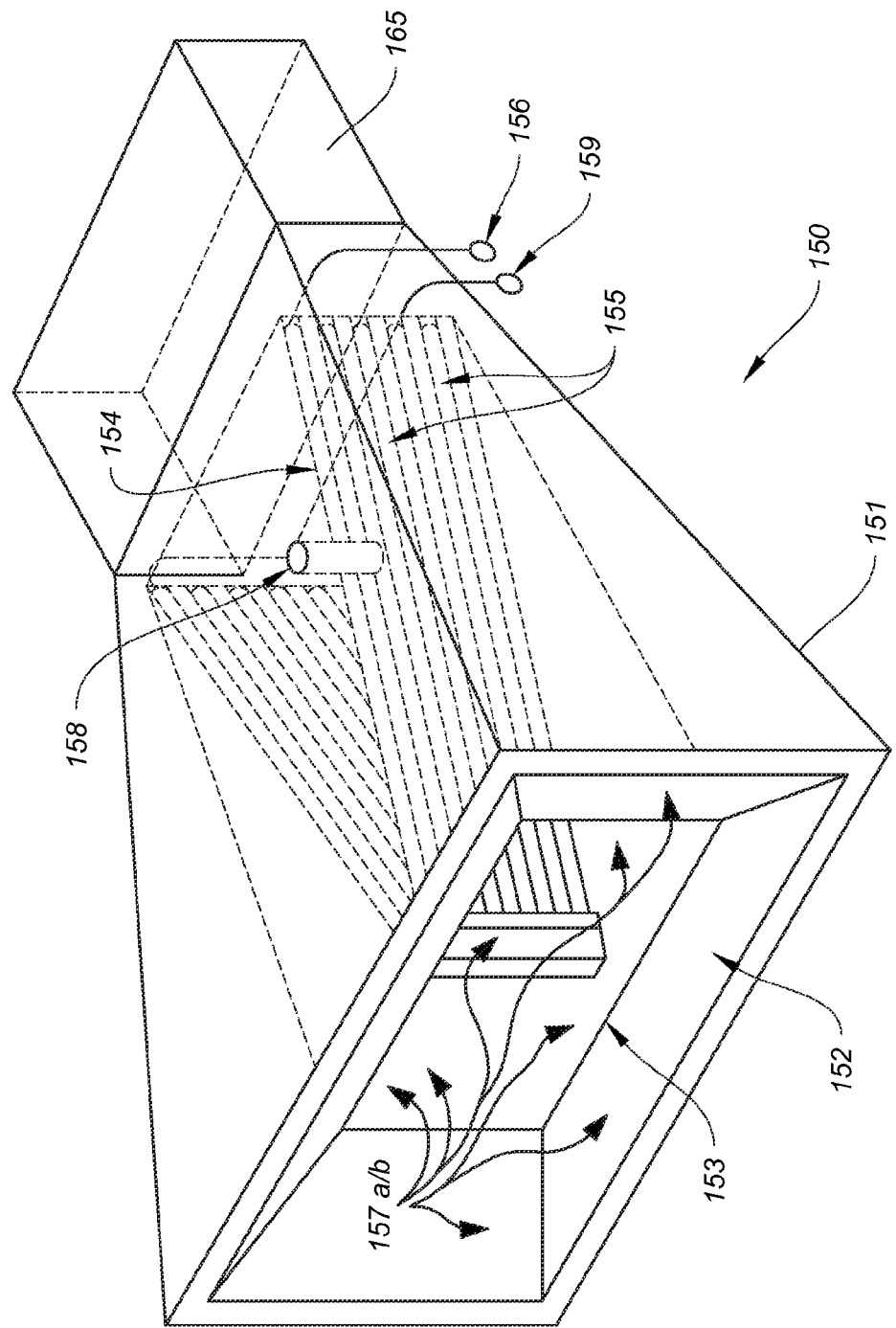
FIG. 6 is an enlarged view of the collector subsystem to illustrate constituent component details thereof.

FIG. 5 is a side profile view to illustrate the relative incident angle of reflection onto the collector subsystem according to the example embodiment; and FIG. 6 is an enlarged view of the collector subsystem to illustrate constituent component details thereof. The efficiency at which these photons are captured by the V-shaped core heat mechanism 154 is a function in part of the relative height of the collector housing 151 to the reflector subsystem 120, as can be best seen in FIG. 5, but also shown in FIGS. 3 and 4. The collector subsystem 150 is elevated relative to the reflector subsystem 120 and in the direction of the sun, so that the housing 151 is in the direct incident path of the sun's downward rays. The angled degree of incidence of the reflected photon energy off of the reflectors 121 of subsystem 120 to the front of collector housing 151 ideally would be 0 degrees to realize zero thermal loss, but with azimuth changes between winter and summer seasons, the elevational positioning of the collector housing 151 and gimbal 125 rotations cooperate to minimize loss of thermal energy (and hence maximize efficiency) upon photon reflection to the collector subsystem 150. Specifically, the elevational positioning of the V-shaped core heat mechanism 154 above that of the reflectors 121 aids in reducing thermal loss (of reflected photon energy) alone. Coupling that with proper gimbal 125 rotation based on time of day and year (winter/summer) to account for azimuthal changes in the sun further improves efficiency at which the reflected photons are captured within the -shaped core heat mechanism 154 of housing 151.

In one example, housing 151 comprises a reinforced Styrofoam insulated shell, and the glass window 153 may be formed of leaded tempered glass. The V-shaped core heat mechanism 154 may include a plurality of heat exchanger tubes 155 as best shown in phantom lines in FIG. 6, the tubes 155 receiving a fluent medium via inlet 156 to be heated by reflected photon energy captured off the reflector subsystem 120. Either side of the V-shaped panel of tubes 155 is encased within sheets of mirrored or tempered fluted glass to facilitate heat transfer there through to the fluent medium be carried in the tubes 155. Accordingly, the entire interior surface of the housing 151 is mirrored. In fact, the entire interior surface of the housing 151 and the exterior surface of the V-shaped core heat mechanism 154 are mirrored surfaces.

In an example, the transfer of energy along the fluent medium within tubes 155 to be ported via outlet 159 can be directed to an external holding or storage tank via pump 158. In an example, this may be a 9 volt DC pump powered by a storage cell or battery, shown generally by auxiliary unit 165. In FIG. 5 auxiliary unit 165 in one example comprises a 45 W photovoltaic cell 170 charged via mirrored surfaces of cavity 175. The pump 158 takes the draw via intake lines 156 and ports the fluent medium via output line 159 to the storage holding tank (not shown). The heated fluent medium within the storage holding tank then can be used to heat any desired outsource such as a hot water tank, in ground swimming pool or other downstream equipment, for example. The fluent medium may be a well known conductor or heat transfer medium such as water or oil/glycol, for example.

As best shown in FIG. 6, the plurality of heat exchanger tubes 155 is wrapped in parallel relation to form the V-shape of the core heat mechanism. In a variant, if desired, various tubes may be crimped at different locations along its length to promote turbulent flow thereon so as to enhance absorption properties of the fluent medium at capturing photons, for example. In a further variant, internal passageways within the tubes 155 may be restricted by bearing surfaces to increase pressure flow at certain locations to provide as similar enhanced turbulent flow effect therein.

FIG. 7 is an enlarged partial view of the rear of the collector subsystem to illustrate constituent components of an auxiliary unit in more detail thereof, and FIG. 8 is a side view of the collector subsystem to illustrate selected constituent components thereof. The auxiliary unit 165 may be configured at a distal end of collector housing 151, to include a three-sided photovoltaic cell 170 supported by arms 177 within a two-sided, angular mirrored-surface cavity formed into the distal end of collector housing 151, the cavity indicated generally by arrows 175, with the sides formed at an angle to receive both direct and reflected photon energy from the sunlight. As shown in several ones of the figures, the cell 170 is oriented directly in the path of direct sunlight, receiving both direct and reflected photon energy via the two angled, mirrored surfaces in cavity 175 onto all three sides of the cell 170.

In an example, cell 170 may be configured to cooperate with rail-style charging terminals so as to support and charge one or more rail-style battery packs thereon. In this embodiment, the auxiliary unit 165 may be configured as an in-the-field charging station for portable power tools, in which the cell 170 serves as a power source. This eliminates the need for diesel or gas powered generators with associated fossil fuel canisters to power portable electrical outlets for conventional charging stations in remote locations.

The auxiliary unit 165 however is not limited to the aforementioned charging application however; and may serve other uses in which the thermal energy absorbed in the collector subsystem 150 may be output and/or converted for storage in one or more storage battery cells for later use, as contemplated by the example embodiments.

The example embodiments being thus described, it will be obvious that the same may be varied in many ways. Such variations are not to be regarded as departure from the example embodiments, and all such modifications as would be obvious to one skilled in the art are intended to be included herein.

What is claimed is:

1. A solar collection system for generating thermal power, comprising:
    an elongate central truss angled upward from ground horizontal and mounted on a plurality of ground support legs,
    a collector subsystem mounted at one end of the central truss,
    a cross truss perpendicular to the central truss and mounted at an end of the central truss opposite the collector subsystem,
    a reflector subsystem mounted on the cross truss,
    the collector subsystem including a truncated trapezoid-shaped housing with a front side facing the reflector subsystem, the front side including a glassed-in opening fronting a V-shaped core heat mechanism enclosed within the housing interior that captures reflected photon energy from the reflector subsystem which heats a fluent medium within the V-shaped core heat mechanism for output to an external source for thermal power operations, the system further including:
    a pump, and
    a three-sided photovoltaic cell powering the pump and attached to the housing, the heated fluent medium ported via an outlet of the housing to an external holding or storage tank via the pump, wherein
    the housing includes a two-sided, angular mirrored-surface cavity having two angled mirrored sides formed into the distal end thereof, with each of the angled mirrored sides formed at an angle into the housing to receive both direct and reflected photon energy from the sunlight, two of the sides of the photovoltaic cell in adjacent spaced relation to the two angled mirrored sides forming the cavity in the housing distal end, and
    the photovoltaic cell is oriented directly in the path of direct sunlight, receiving both direct and reflected photon energy via the two angled, mirrored sides of the cavity onto all three sides of the cell.

2. The system of claim 1, wherein the collector subsystem is elevated on the central truss relative to the reflector subsystem and in the direction of the sun, so that the housing is in the direct incident path of the sun's downward rays.

3. The system of claim 2, wherein the relative height of the collector subsystem to reflector subsystem reduces reflected photon energy loss as photons are captured by the V-shaped core heat mechanism.

4. The system of claim 2, wherein the reflector subsystem further includes:
    a plurality of reflectors arranged in spaced relation along the cross truss, and
    a gimbal mechanism attached to each reflector.

5. The system of claim 4, wherein the relative height of the collector subsystem to reflector subsystem, coupled with repositioning of the reflectors by the gimbals, reduces reflected photon energy loss as reflected photons are captured off surfaces of the reflectors by the V-shaped core heat mechanism.

6. The system of claim 1, wherein the housing is composed of a reinforced Styrofoam insulated shell.

7. The system of claim 1, wherein the glassed-in opening is a glass window of leaded tempered glass.

8. The system of claim 1, wherein
    the V-shaped core heat mechanism includes a plurality of heat exchanger tubes forming two panels of the V and containing a fluent medium received through an inlet of the housing, the tubes heated by reflected photon energy captured off the reflector subsystem, the heated fluent medium output for thermal power operations.

9. The system of claim 1, wherein the photovoltaic cell is configurable as a power source for charging battery packs of power tools.

10. A solar collection system for generating thermal power, comprising:
    an elongate central truss angled upward from ground horizontal and mounted on a plurality of ground support legs,
    a cross truss perpendicular to the central truss and mounted at one end of the central truss,
    a plurality of reflectors mounted in spaced relation on the cross truss,
    a truncated trapezoid-shaped housing mounted at the other end of the central truss at a higher height relative to the ground than the reflectors, the housing enclosing a V-shaped core heat mechanism containing a fluent medium therein, the V-shaped core heat mechanism configured to capture reflected photon energy from the reflectors,
    a pump, and
    a three-sided photovoltaic cell attached to the housing and powering the pump to output the heated fluent medium to an external source for thermal power operations, wherein
    the housing includes a two-sided, angular mirrored-surface cavity having two angled mirrored sides formed into the distal end thereof, with each of the angled mirrored sides formed at an angle into the housing to receive both direct and reflected photon energy from the sunlight, two of the sides of the photovoltaic cell in adjacent spaced relation to the two angled mirrored sides formed the cavity in the housing distal end, and
    the photovoltaic cell is oriented directly in the path of direct sunlight, receiving both direct and reflected photon energy via the two angled mirrored sides of the cavity onto all three sides of the cell.

11. The system of claim 10, wherein the housing is elevated relative to the reflectors and in the direction of the sun so as to be in the direct incident path of the sun's downward rays.

12. The system of claim 11, further comprising:
a gimbal mechanism attached to each reflector,
wherein the relative height of the housing to reflectors, coupled with repositioning of the reflectors by the gimbals, reduces reflected photon energy loss as reflected photons are captured off surfaces of the reflectors by the V-shaped core heat mechanism.

* * * * *